United States Patent
Kohsiek

(10) Patent No.: US 6,867,636 B2
(45) Date of Patent: Mar. 15, 2005

(54) CIRCUIT ARRANGEMENT FOR A CURRENT-CONTROLLED RESISTOR HAVING AN ENLARGED LINEAR RANGE

(75) Inventor: Cord Heinrich Kohsiek, Ellerau (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/369,929

(22) Filed: Feb. 19, 2003

(65) Prior Publication Data

US 2003/0227317 A1 Dec. 11, 2003

(30) Foreign Application Priority Data

Feb. 22, 2002  (DE) ........................................ 102 07 675

(51) Int. Cl.[7] .............................................. H03K 17/56
(52) U.S. Cl. ...................................... 327/423; 327/478
(58) Field of Search ............................ 327/82–84, 405, 327/423–424, 432–437, 478, 482, 489, 493–494, 496, 504, 508, 587–588, 330, 192, 334–336, 427, 492

(56) References Cited

U.S. PATENT DOCUMENTS

| | | | |
|---|---|---|---|
| 3,983,512 A | * | 9/1976 | Lipscombe ............. 331/108 B |
| 4,659,945 A | * | 4/1987 | Metz ............................ 327/92 |
| 4,682,098 A | * | 7/1987 | Seevinck et al. ............ 323/315 |
| 4,885,545 A | * | 12/1989 | Sanielevici ................... 327/92 |
| 5,029,129 A | * | 7/1991 | Wai Wong .................. 365/155 |
| 5,745,003 A | * | 4/1998 | Wakimoto et al. .......... 327/382 |
| 6,211,723 B1 | * | 4/2001 | Creek .......................... 327/494 |
| 6,424,201 B2 | * | 7/2002 | Yamamoto et al. ......... 327/502 |

* cited by examiner

*Primary Examiner*—My-Trang Nuton
(74) *Attorney, Agent, or Firm*—Michael Ure

(57) ABSTRACT

A circuit arrangement for a resistor of high linearity that can be produced in integrated technology and be controlled by the current (Io1, Io2), which circuit arrangement is constructed from two pairs of transistors comprising transistors (T1 . . . T4) of the same junction type connected as diodes. Each pair of transistors (T1, T2 and T3, T4) has a common point of connection (D, E) that connects together the anodes of one pair of diodes and the cathodes of the other pair. The point of connection (D) of the first pair of transistors (T1, T2) is situated on their collector lines and thus connects the anodes and forms the infeed point for a first control current source (Io1). The point of connection (E) of the second pair of transistors connects the cathodes and is thus situated on their emitter lines and forms the infeed point for a second control current source (Io2). The emitter line of the first transistor (T1) in the first pair of transistors (T1, T2) is connected to the collector line of the first transistor (T3) in the second pair, this point of connection (B) also forming one terminal (A') of the resistor. The emitter line of the second transistor (T2) in the first pair is connected to the collector line of the second transistor (T4) in the second pair, this point of connection (C) being connected to the second terminal (A") of the resistor. The current-controlled resistor according to the invention has high linearity and is easy to produce in terms of circuitry.

8 Claims, 3 Drawing Sheets

Figure 1:
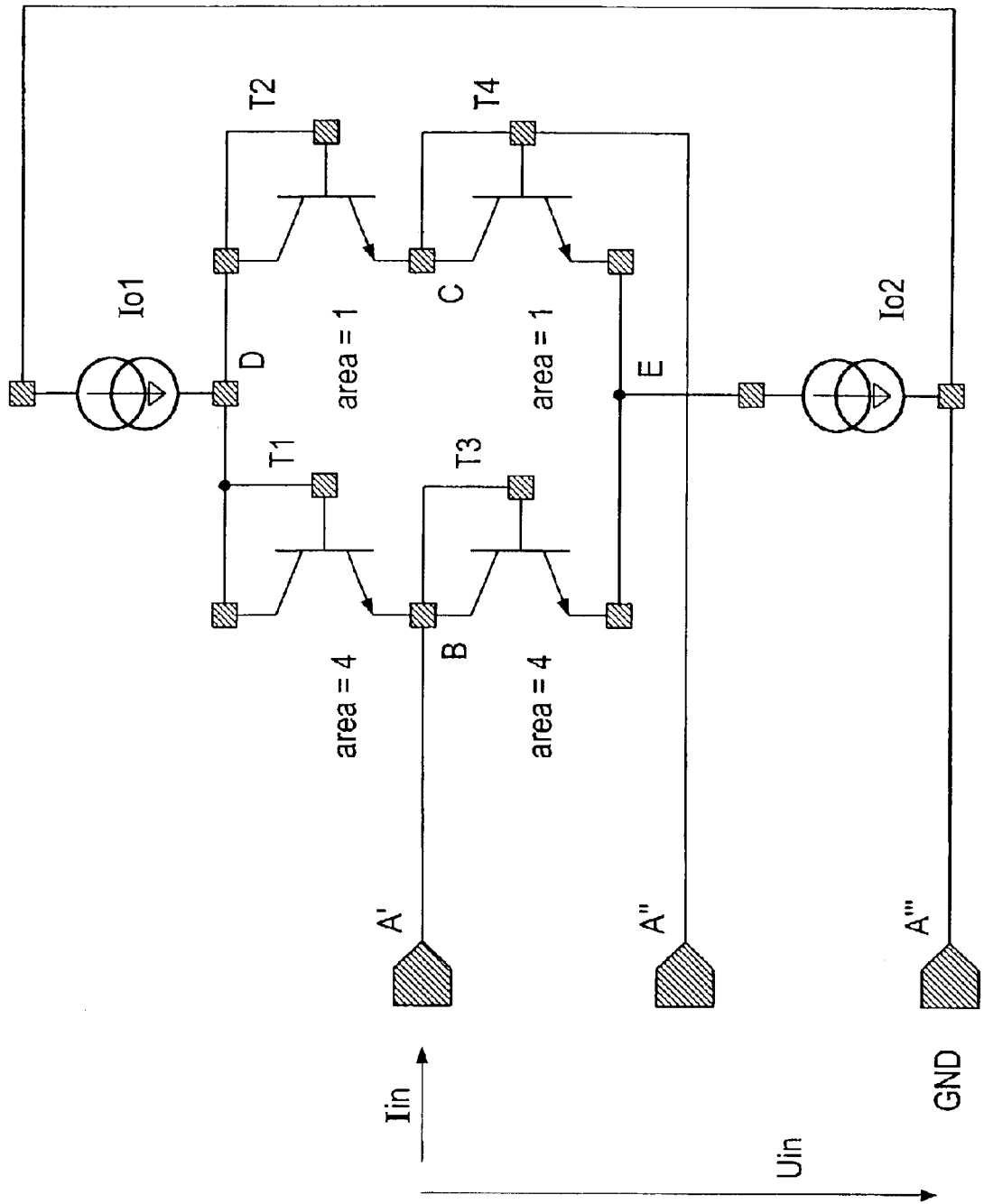

CIRCUIT ARRANGEMENT FOR A CURRENT-CONTROLLED RESISTOR HAVING AN ENLARGED LINEAR RANGE

The invention relates to a circuit arrangement for a current-controlled resistor having an enlarged linear range.

Diodes or transistors whose internal resistance is controlled by current are used in bipolar integrated circuits as controllable resistors. The disadvantage they have is the limited linearity of the variation of their resistance, which is due to the use of components which are not, in themselves, linear.

Known from DE 30 27 071 A1 is the use of two pairs of transistors as a transistorized amplifier, with each pair of transistors comprising two NPN transistors whose emitters are connected directly together. Connected to the common emitter supply lines of the pairs of transistors are respective constant-current sources, i.e. d.c. current sources whose current is independent of the voltage at the base electrodes of the associated pair of transistors. The other terminal of the constant-current sources is connected to ground. The collector electrode of the first transistor in the first pair is connected to the first collector electrode of the second pair, the common collector connection being connected, via a resistor, to a positive supply voltage and at the same time forming the output terminal A of the amplifier. In a similar way, the collector electrode of the second transistor in the first pair is connected to the second collector electrode of the second pair and the common collector connection is connected, via a resistor, to the same positive supply voltage and at the same time forms the output terminal A'. The characteristic curves of the four transistors are all the same. To improve the non-linear distortion in this circuit arrangement, a d.c. voltage source is connected to the supply line supplying the base current to one transistor in each pair of transistors. In another version of a transistorized amplifier as disclosed in DE 30 27 071 A1 the additional d.c. voltage source in the base current circuit is dispensed with and the improvement in non-linear distortion is achieved by making an emitter area of a pair of transistors larger by a factor k than the other emitter area.

The slope of the characteristic of the circuit arrangement described in DE 30 27 071 A1 for a linearized resistor is controllable by the size of the current from the current sources. What this means is that the amount of gain between the input voltage at the pair of input terminals and the output current at the pair of output terminals can be controlled. This circuit is that of a four-terminal voltage-to-current converter.

The circuit arrangement described in DE 30 27 071 A1 contains the linearized controllable resistor as a non-detachable component of a differential amplifier, which component is thus cannot be used separately.

It is, therefore, an object of the invention to provide a current-controlled resistor of high linearity which can be produced in integrated technology, can be inserted as a two-terminal component in other circuits, comprises transistors of the same junction type and is controllable by current sources.

This object is achieved by a circuit arrangement as disclosed in claim 1. The invention is based on the finding that the combination of two asymmetrical and shifted differential amplifier characteristics results in the curvatures of the characteristics at least partly compensating for one another.

In accordance with the invention, a circuit arrangement is proposed for a current-controlled resistor having an enlarged linear range, using an arrangement of non-linear bipolar elements wherein the resistance is generated between a first and a second terminal, having a first control terminal (D) that is fed by a first current source (Io1), a second control terminal (E) that is fed by a second current source (Io2), and a shift in characteristic caused by different area factors, wherein the arrangement of the non-linear elements comprises essentially two pairs of bipolar transistors of the same junction type, which transistors have a common point of connection and in each case have their bases and collectors connected together so that they act as diodes, the point of connection of the first pair of transistors is on their common collector line and is at the same time the infeed point for the first control current source, the point of connection of the second pair of transistors is on their common emitter line and is at the same time the infeed point for a second control current source, the transistors are of the same junction type but have different area factors, the two transistor diodes forming a pair have different area factors, the area factor of the first transistor diode in the first pair being the same as the area factor of the first transistor diode in the second pair and the area factor of the second transistor in the first pair being the same as the area factor of the second transistor in the second pair, the emitter line of the first transistor in the first pair has a point of connection to the collector line of the first transistor in the second pair, this point of connection also being the first resistor terminal, the emitter line of the second transistor in the first pair has a point of connection to the collector line of the second transistor in the second pair, this point of connection also being the second resistor terminal, the two control current sources have a common ground terminal and the two control current sources supply currents of the same size.

In this way it is possible to produce a linearized resistor that can be controlled over a wide range and whose conductance is proportional to the control current. The circuit according to the invention is a two-terminal component that has only two terminals for the signal to be processed, between which terminals a defined current-to-voltage relationship having special properties is established.

The invention is used for gain control, as a PIN diode, as a modulator, as a multiplier, as an attenuator or as a controllable high-pass or low-pass filter.

An advantage of the invention is the fact that the control current and the signal current are not carried by the same terminals.

These and other aspects of the invention are apparent from and will be elucidated, by way of example, with reference to the embodiments described hereinafter.

Figure 2:
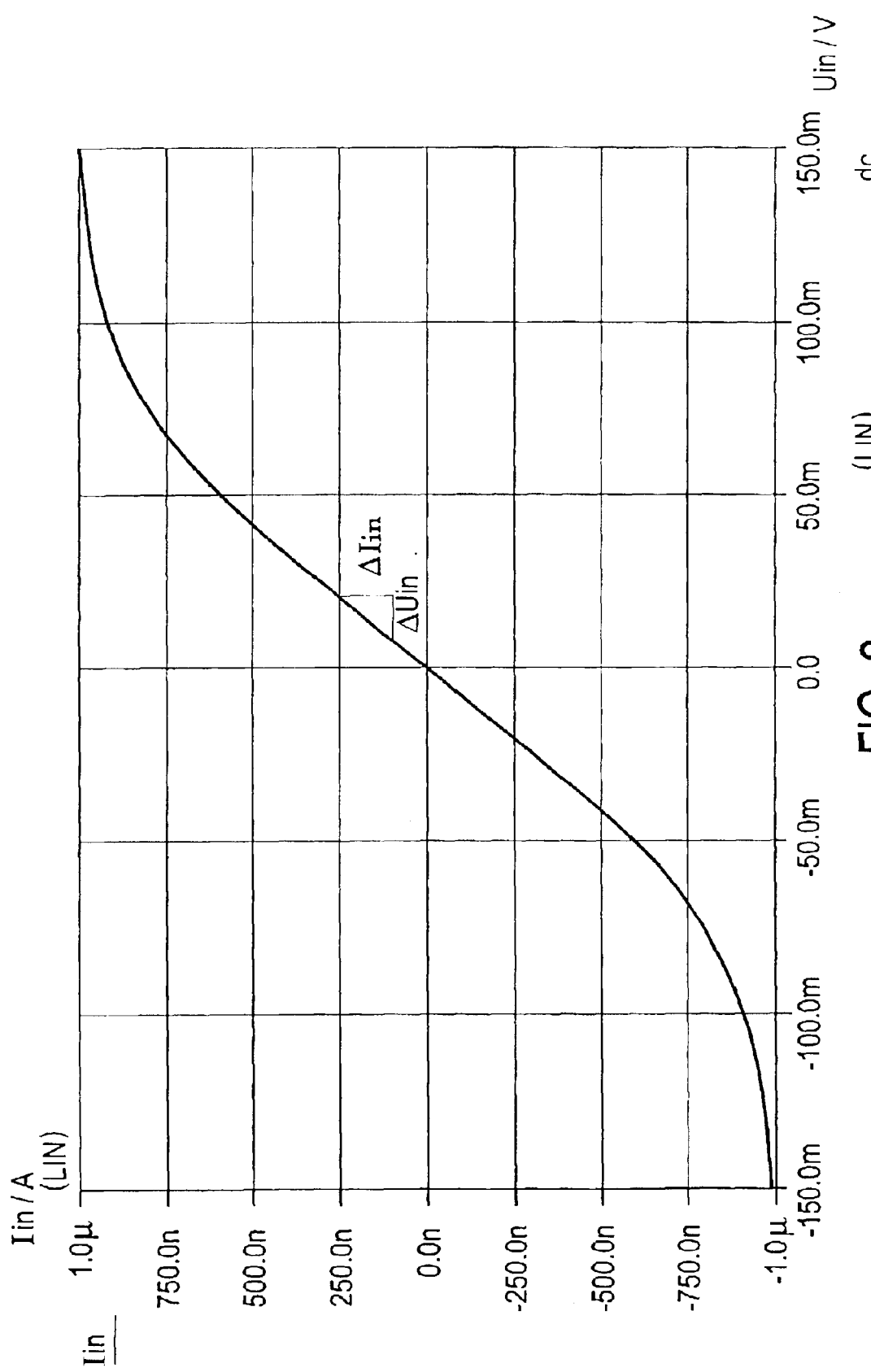
Figure 3:
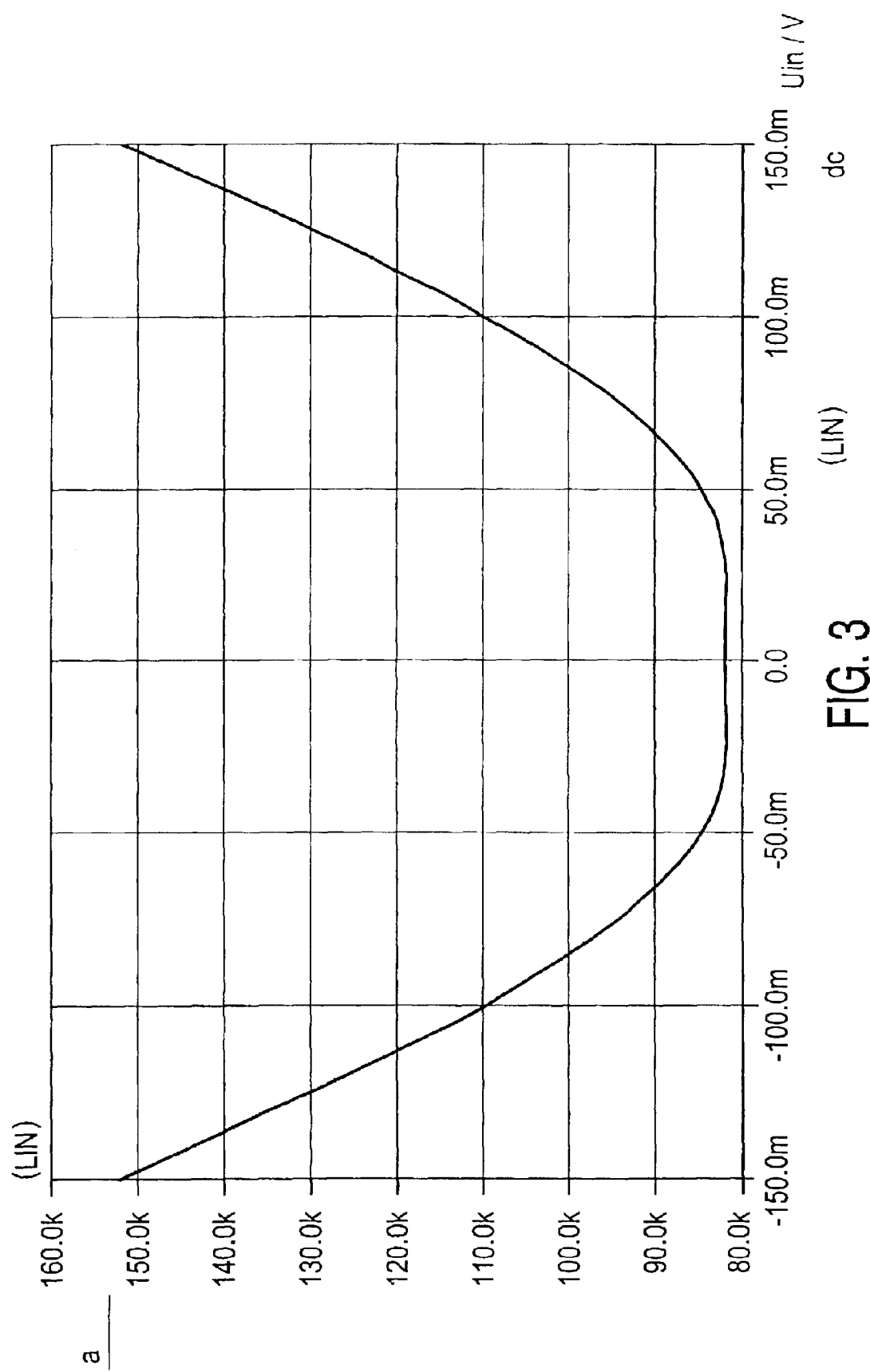

In the drawings:

FIG. 1 shows an embodiment of the circuit arrangement according to the invention, FIG. 2 shows the characteristic of the circuit arrangement of FIG. 1 and FIG. 3 shows the variation of the resistance of the circuit of FIG. 1 as a function of voltage.

The embodiment of the circuit arrangement according to the invention shown in FIG. 1 has first and second terminals A' and A" for making connections to the resistor, which terminals A' and A" are connected to first and second points of connection B and C, respectively. Control signals are produced by two current sources Io1 and Io2 supplying currents of equal size, which sources are connected to third and fourth points of connection D and E, respectively. A further terminal A'" forms a ground terminal GND.

The circuit comprises two pairs of transistors T1, T2 and T3, T4, the bases and collectors of each of the transistors T1 . . . T4 being connected together in this embodiment so that the transistors T1 . . . T4 act as diodes. The third point of connection D is the point of connection of the first pair of transistors and is thus situated in the collector line of the transistors T1 and T2 and at the same time it is the infeed point for a first one of the current sources Io1, Io2, that is, the constant-current source Io1. The fourth point of connection E, the point of connection of the transistors T3 and T4 forming the second pair of transistors T3, T4, is situated in the common emitter line of these transistors and it is at the same time the infeed point for a second one of the current sources Io1, Io2, that is, the constant-current source Io2.

The first and second pairs of transistors T1, T2 and T3, T4 are connected together at the points of connection B and C. In this case, the emitter line of the first transistor T1 in the first pair of transistors T1, T2 is connected to the collector line of the first transistor T3 in the second pair of transistors T3, T4 at the point of connection B, and similarly the emitter line of the second transistor T2 in the first pair of transistors T1, T2 is connected to the collector line of the second transistor T4 in the second pair of transistors T3, T4 at the point of connection C.

In a preferred embodiment, the two first transistors T1, T3 in the first and second pairs of transistors T1, T2 and T3, T4 have the same area factor "area" and this area factor is different from the common area factor of the second transistors T2, T4 in the first and second pairs of transistors T1, T2 and T3, T4. In this embodiment the area factor "area" of the two first transistors T1, T3 in the first and second pairs of transistors T1, T2 and T3, T4 is four times higher than the area factor "area" of the two second transistors T2, T4 in the first and second pairs of transistors T1, T2 and T3, T4 and is area=4 for the transistors T1 and T3 and
area=1 for the transistors T2 and T4.

The circuit arrangement can be implemented with both NPN and PNP transistors and it is also possible for N-channel or P-channel field-effect transistors or even discrete diodes to be used.

FIG. 2 shows a graph of the differential-amplifier characteristic of the embodiment of the circuit arrangement according to the invention. What is shown is the current Iin measured at the point of connection B of the transistors T1 and T3, plotted versus the input voltage Uin measured between the terminals A' and A'". It can be seen that the characteristic follows a straight path, i.e. its slope s is constant, over a range about its center which is plotted as 0.0, 0.0. Equation (1) gives the conductance of the current-controlled resistor forming the embodiment of the invention and is:

$$s = \frac{\Delta Iin}{\Delta Uin} \qquad (1)$$

where ΔIin is an increment of the current Iin and Δuin is an increment of the input voltage Uin.

The behavior of the current Iin generated by the input voltage Uin is thus proportional to the input voltage Uin. At voltage levels that are more remote from the zero point, the characteristic assumes the typical curved shape. It can also be seen that a positive input voltage Uin generates a positive current Iin and a negative input voltage Uin generates a negative current Iin.

The graph shown in FIG. 3 shows the variation of the resistance of the current-controlled resistor as a function of the input voltage Uin. Equation (2) for this resistance variation a is given by the reciprocal of the conductance s and is:

$$a = \frac{1}{s} = \frac{\Delta Uin}{\Delta Iin} \qquad (2)$$

It can clearly be seen that the value of the resistance is constant about the zero point, being a value of approximately 81.5 kΩ in this embodiment.

List of Reference Numerals

| | |
|---|---|
| a | Variation of the resistance of the current-controlled resistor as a function of the input voltage Uin |
| A' | First terminal for connecting the resistor, or first resistor terminal |
| A" | Second terminal for connecting the resistor, or second resistor terminal |
| A'" | Further terminal, forms the ground terminal GND |
| area | Area factor of the transistors T1, T2, T3 and T4 |
| B | First point of connection |
| C | Second point of connection |
| D | Third point of connection, or first control terminal, which is fed by the first current source Io1 |
| E | Fourth point of connection, or second control terminal, which is fed by the second current source Io2 |
| GND | Ground terminal formed by the terminal A'" |
| Iin | Current measured at the point of connection B |
| Io1 | First current source, or first constant-current source, or first control current source |
| Io2 | Second current source, or second constant-current source, or second control current source |
| s | Variation of the conductance of the current-controlled resistor as a function of the input voltage Uin |
| T1 | Transistor; first transistor in the first pair of transistors |
| T2 | Transistor; second transistor in the first pair of transistors |
| T3 | Transistor; first transistor in the second pair of transistors |
| T4 | Transistor; second transistor in the second pair of transistors |
| T1, T2 | First pair of transistors |
| T3, T4 | Second pair of transistors |
| Uin | Input voltage |
| ΔIin | Increment of current Iin |
| ΔUin | Increment of voltage Uin |

What is claimed is:

1. A circuit arrangement for controlling a resistance between a first and a second terminal, which circuit arrangement comprises a first and second pair of transistors, characterized in that the emitter of the first transistor in the first pair of transistors and the collector and the base of the first transistor in the second pair of transistors am connected to the first terminal forming a first point of connection, and the emitter of the second transistor in the first pair of transistors and the collector and the base of the second transistor in the second pair of transistors are connected to the second terminal forming a second point of connection in that the two collectors of the first pair of transistors and the two bases of the first pair of transistors are connected to a third point of connection, and in that the two emitters of the second pair of transistors are connected to a fourth point of connection, and characterized in that the respective first transistor in the first and second pairs of transistors is arranged to be larger by an area factor than the respective second transistor in the first and second pairs of transistors.

2. A circuit arrangement as claimed in claim 1, characterized in that the infeed point for a first control current source is the third point of connection.

3. A circuit arrangement as claimed in claim 1, characterized in that the infeed point for a second control current source is the fourth point of connection.

4. A circuit arrangement as claimed in claim 1, characterized in that the transistors are connected to form transistor diodes.

5. A circuit arrangement as claimed in claim 1, characterized in that the four transistors are of the same junction type.

6. A circuit arrangement as claimed in claim 1, characterized in that the area factor is 4.

7. A circuit arrangement as claimed in claim 1, characterized in that the transistors are formed as diodes or NPN or PNP transistors, or N-channel or P-channel field-effect transistors.

8. The use of a circuit arrangement as claimed in claim 1 for gain control, as a PIN diode, as a modulator, as a multiplier, as an attenuator, or as a controllable high-pass or low-pass filter.

* * * * *